(12) United States Patent
Moh

(10) Patent No.: US 9,130,409 B2
(45) Date of Patent: Sep. 8, 2015

(54) WIRELESS ENERGY RECEIVER/TRANSMITTER/SYSTEM AND WIRELESS ENERGY TRANSMISSION METHOD

(71) Applicant: Kyung Goo Moh, Yongin-Si (KR)

(72) Inventor: Kyung Goo Moh, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 482 days.

(21) Appl. No.: 13/677,453

(22) Filed: Nov. 15, 2012

(65) Prior Publication Data
US 2013/0127258 A1 May 23, 2013

(30) Foreign Application Priority Data
Nov. 17, 2011 (KR) .................. 10-2011-0120520

(51) Int. Cl.
| | | |
|---|---|---|
| *H02J 17/00* | (2006.01) | |
| *H02J 5/00* | (2006.01) | |
| *H03J 3/20* | (2006.01) | |
| *H01F 27/42* | (2006.01) | |

(52) U.S. Cl.
CPC .................. *H02J 17/00* (2013.01); *H02J 5/005* (2013.01); *H03J 3/20* (2013.01)

(58) Field of Classification Search
USPC ........................................................ 307/104
See application file for complete search history.

(56) References Cited

U.S. PATENT DOCUMENTS

| | | |
|---|---|---|
| 7,375,596 B2 | 5/2008 | Park et al. |
| 7,741,734 B2 | 6/2010 | Joannopoulos et al. |
| 2008/0211320 A1 | 9/2008 | Cook et al. |
| 2009/0284220 A1 | 11/2009 | Toncich et al. |

FOREIGN PATENT DOCUMENTS

KR 20060091192 A 8/2006

*Primary Examiner* — Robert Deberadinis
(74) *Attorney, Agent, or Firm* — Volentine & Whitt, PLLC

(57) ABSTRACT

A wireless energy transmission system includes a wireless energy transmitting device and a wireless energy receiving device configured to receive power from the wireless energy transmitting device through a magnetic field. The wireless energy transmitting device includes a signal generator configured to include a resonator including at least one inductor and at least one capacitor and to generate at least two signals having a 90-degree phase difference from each other. The wireless energy receiving device includes a frequency adjustor configured to match a frequency between the wireless energy transmitting device and the wireless energy receiving device.

20 Claims, 19 Drawing Sheets

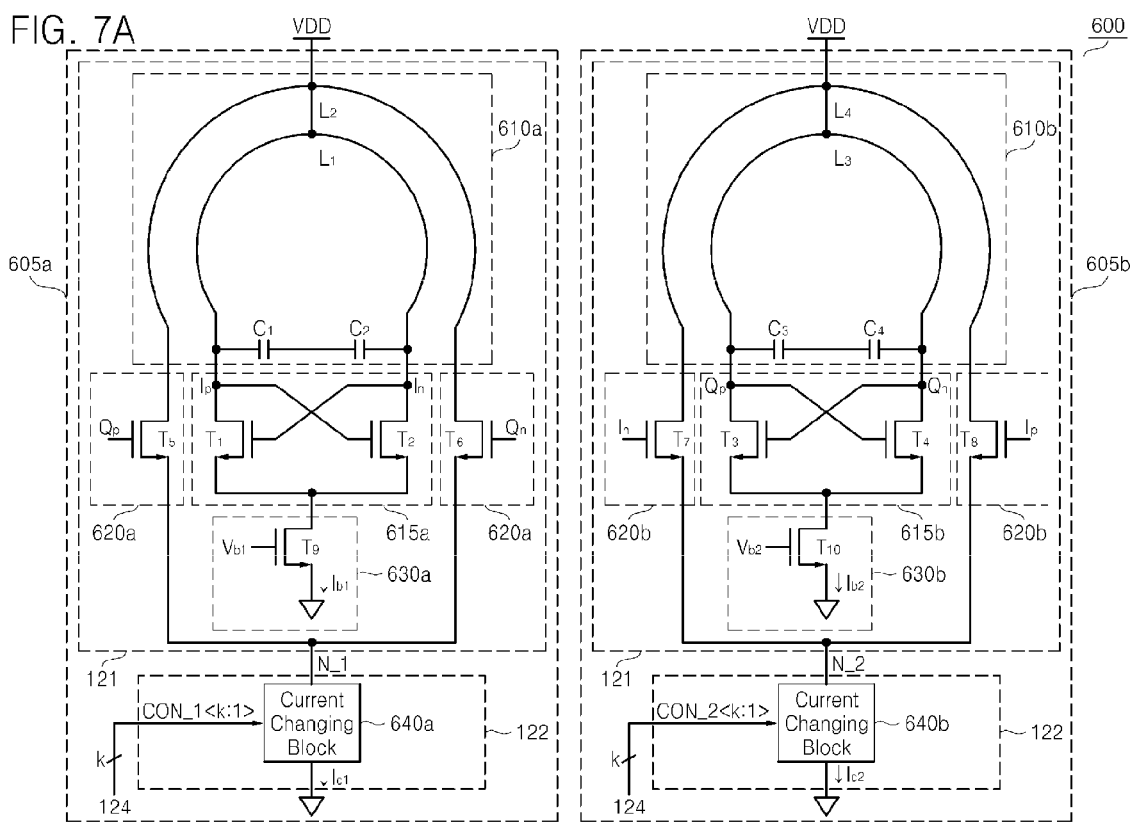

US 9,130,409 B2

WIRELESS ENERGY RECEIVER/TRANSMITTER/SYSTEM AND WIRELESS ENERGY TRANSMISSION METHOD

CROSS-REFERENCE TO RELATED APPLICATIONS

This application claims priority under 35 U.S.C. §119 to Korean Patent Application No. 10-2011-0120520 filed on Nov. 17, 2011, the subject matter of which is hereby incorporated by reference.

BACKGROUND

Embodiments of the inventive concept relate to wireless energy receivers (receiving devices), wireless energy transmitters (transmitting devices), wireless energy transmission systems, and wireless energy transmission methods realizing efficient wireless energy transmission.

A great deal of research into wireless energy transmission using electromagnetic induction has been conducted. Yet, electrical power may be conventionally transmitted using electromagnetic induction across relatively short distances (e.g., several centimeters).

In order to overcome this limitation, a method of using magnetic resonance has been introduced. For wireless energy transmission using the magnetic resonance, LC resonance may be used and a common resonance frequency may be tuned between a transmitter/receiver pair. During this resonance frequency tuning process, the capacitance value is typically adjusted. However, it is not easy to finely adjust the capacitance value, and therefore, it is difficult to accurately perform resonance frequency tuning.

Accordingly, a better approach to resonance frequency tuning is desired that does not require direct adjustment the inductance value "L" or the capacitance value "C".

SUMMARY

According to certain embodiments of the inventive concept, there is provided a wireless energy transmission system including a wireless energy receiving device and a wireless energy transmitting device. At least one of the wireless energy receiving device and the wireless energy transmitting device comprises; a first oscillator configured to output an in-phase (I) signal, a second oscillator configured to output a quadrature-phase (Q) signal having a 90-degree phase difference from the I signal, wherein each of the first and second oscillators comprises a resonator having at least one inductor and at least one capacitor, and a current changing block connected to the at least one inductor and configured to change an amount of current flowing through the at least one inductor, and a monitor configured to monitor a frequency of at least one of the I and Q signals and control the current changing block according to a monitoring result.

According to certain embodiments of the inventive concept, there is provided a wireless energy receiving device comprising; a first oscillator configured to output an in-phase (I) signal, and a second oscillator configured to output a quadrature-phase (Q) signal having a 90-degree phase difference from the I signal. Each one of the first and second oscillators comprises; a first inductor pair having first mutual inductance and comprising a first inductor and a second inductor, a second inductor pair having second mutual inductance and comprising a third inductor and a fourth inductor, and a capacitor connected between the first inductor and the third inductor, wherein each of the first and second oscillators controls a magnitude of received wireless energy by changing a resonance frequency by changing an amount of current flowing through the second and fourth inductors.

According to certain embodiments of the inventive concept, there is provided an electronic system comprising; a wireless energy receiving device configured to receive wireless energy from a wireless energy transmitting device through a magnetic field and generate reception power, and a power unit configured to receive the reception power from the wireless energy receiving device and supply at least a portion of internal power necessary for operation of the electronic system. The wireless energy receiving device comprises; a first oscillator configured to output an in-phase (I) signal, and a second oscillator configured to output a quadrature-phase (Q) signal having a 90-degree phase difference from the I signal. Each of the first and second oscillators comprises; a resonator comprising at least one inductor and at least one capacitor, and a current changing block connected to the at least one inductor to change an amount of current flowing through the at least one inductor.

According to certain embodiments of the inventive concept, there is provided a method of receiving wireless energy using a wireless energy receiving device, the method comprising; generating an in-phase (I) signal and a quadrature-phase (Q) signal having a 90-degree phase difference from the I signal using a quadrature oscillator comprising at least one pair of inductors having mutual inductance, and adjusting a resonance frequency by changing an amount of current flowing through one inductor in the at least one pair of inductors.

BRIEF DESCRIPTION OF THE DRAWINGS

The above and other features and advantages of the inventive concept will become more apparent by describing in detail exemplary embodiments thereof with reference to the attached drawings in which:

FIGS. 6 and 7A are circuit diagrams of a quadrature oscillator that may be included in the transmitting device and/or a receiving device of FIG. 1 according to certain embodiments of the inventive concept;

DETAILED DESCRIPTION OF THE EMBODIMENTS

The inventive concept now will be described in some additional detail with reference to the accompanying drawings. The invention may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
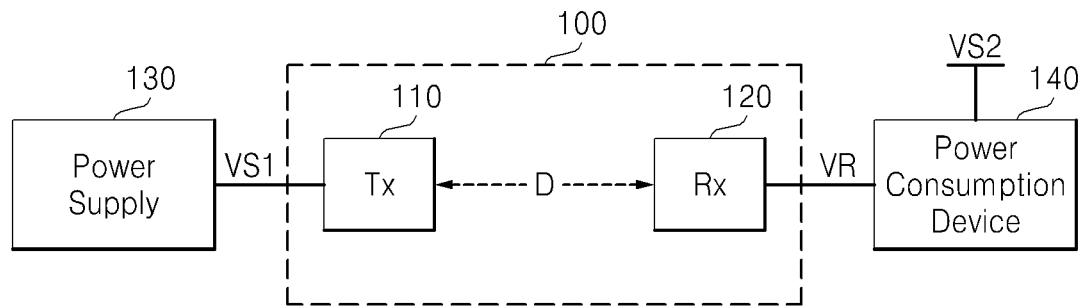
FIG. 1 is a general block diagram of a wireless energy transmission system according to embodiments of the inventive concept.

FIG. 1 is a general block diagram of a wireless energy transmission system 100 according to certain embodiments of the inventive concept. The wireless energy transmission system 100 comprises a transmitting device 110 and a receiving device 120. The transmitting device 110 and the receiving device 120 are separated by a distance "D" (e.g., several centimeters).

The transmitting device 110 may transfer energy to the receiving device 120 via a wireless connection, where the transmitting device 110 and receiving device 120 include a resonator (not shown). The resonator may be an inductance "L"/capacitance "C" (or LC) resonator, but the inventive concept is not restricted thereto.

The transmitting device 110 is connected to a power supply 130 to receive a first power voltage VS1. Wireless energy is transmitted from the transmitting device 110 to the receiving device 120 via an induced magnetic field. That is, a transfer of magnetic energy may be carried out between an inductor included in the transmitting device 110 and an inductor included in the receiving device 120.

The receiving device 120 is connected to a power consumption device 140. The power consumption device 140 consumes power derived from the energy transferred via the wireless connection. For instance, the receiving device 120 may convert the received wireless energy into reception power VR and provide the reception power VR to the power consumption device 140. The power consumption device 140 may use the reception power VR supplied from the receiving device 120 and/or a separate supply power voltage VS2.

The wireless energy transmission system 100 generally includes two devices, i.e., the transmitting device 110 and the receiving device 120, but embodiments of the inventive concept are restricted thereto. The wireless energy transmission system 100 may include three or more devices. In addition, the receiving device 120 and the power consumption device 140 are illustrated as separate elements in FIG. 1, but they may be implemented in a single element.

Figure 2:
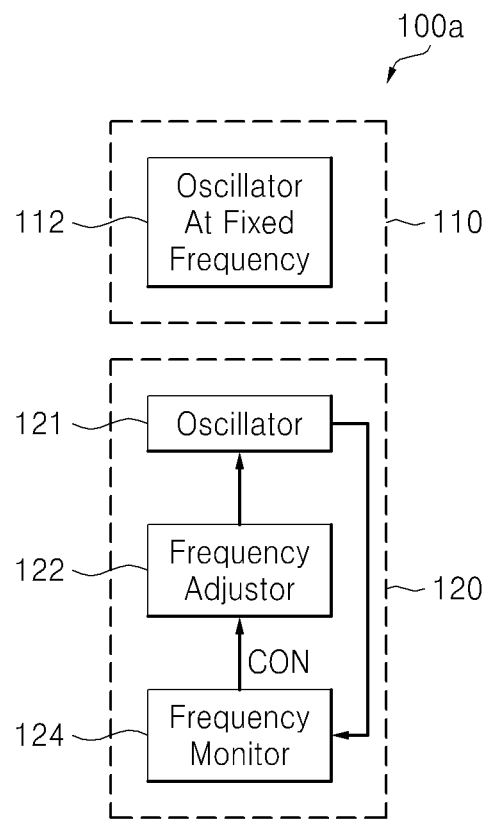
FIG. 2 is a block diagram of a transmitting device and receiving device that may be included in the wireless energy transmission system of FIG. 1 according to certain embodiments of the inventive concept.

FIG. 2 is a block diagram further illustrating the transmitting device 110 and receiving device 120 of the wireless energy transmission system 100a illustrated in FIG. 1. Referring to FIG. 2, the transmitting device 110 includes a fixed frequency oscillator 112. The receiving device 120 includes a variable frequency oscillator 121, a frequency adjustor 122, and a frequency monitor 124.

The fixed frequency oscillator 112 outputs a signal having a fixed frequency. The fixed frequency oscillator 112 and the variable frequency oscillator 121 may include a quadrature oscillator (not shown). The fixed frequency oscillator 112 may output an in-phase (I) signal having a positive signal and a negative signal and a quadrature-phase (Q) signal having a quadrature-phase signal of the positive signal and a quadrature-phase signal of the negative signal. The variable frequency oscillator 121 receives the I and Q signals from the fixed frequency oscillator 112 via a wireless connection. This will be described in some additional detail with reference to FIGS. 6 and 7A.

The frequency monitor 124 monitors the frequency of the variable frequency oscillator 121 and outputs a control signal CON that controls the frequency adjustor 122.

The frequency adjustor 122 adjusts the frequency of the receiving device 120 based on the control signal CON so that the frequency of the receiving device 120 is the same as that of the transmitting device 110. In other words, the frequency adjustor 122 changes the frequency of the variable frequency oscillator 121 in response to the control signal CON of the frequency monitor 124.

In other embodiments of the inventive concept, different approaches such as use of a power monitor (not shown) or a Hall sensor (not shown) may be used instead of the frequency monitor 124. The power monitor may monitor the strength of wireless energy that the receiving device 120 receives from the transmitting device 110 and output the control signal CON to increase the magnitude of the wireless energy. The strength of the wireless energy may be monitored by measuring the strength of the I and Q signals. Alternately, a Hall sensor may detect the strength of a magnetic field and output the control signal CON to increase the strength of the magnetic field. This approach will be described in some additional detail with reference to FIGS. 6 through 9.

Figure 3:
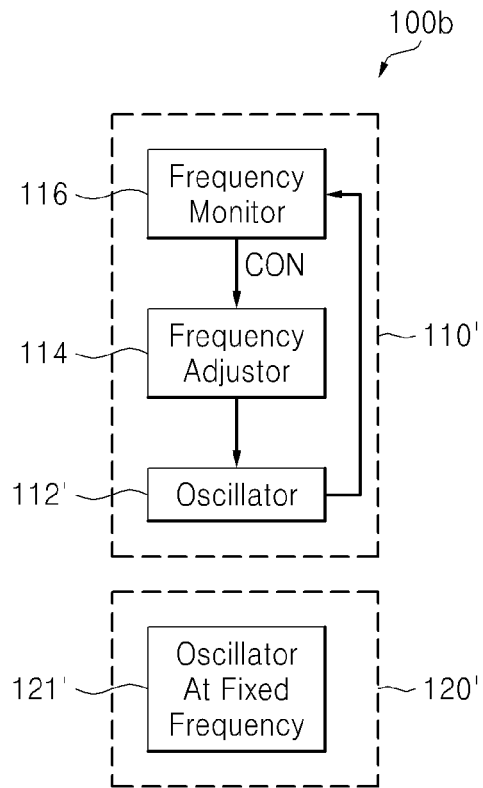
FIG. 3 is a block diagram of a transmitting device and receiving device that may be included in the wireless energy transmission system of FIG. 1 according to other embodiments of the inventive concept.

FIG. 3 is a schematic block diagram of a transmitting device 110' and a receiving device 120' included in the wireless energy transmission system 100b illustrated in FIG. 1 according to other embodiments of the inventive concept. Referring to FIG. 3, the transmitting device 110' includes a variable frequency oscillator 112', a frequency adjustor 114, and a frequency monitor 116. The receiving device 120' includes a fixed frequency oscillator 121'.

The variable frequency oscillator 112' generates a signal having a frequency that can be varied by the frequency adjustor 114. The variable frequency oscillator 112' and the fixed frequency oscillator 121' may include a quadrature oscillator (not shown). The variable frequency oscillator 112' outputs an I signal, which includes a positive signal and a negative signal, and a Q signal, which includes a quadrature-phase output signal of the positive signal and a quadrature-phase output signal of the negative signal. The fixed frequency oscillator 121' receives the I and Q signals from the variable frequency oscillator 112' via a wireless connection. This approach will be described in some additional detail with reference to FIGS. 6 and 7A.

The frequency monitor 116 monitors the frequency of the variable frequency oscillator 112' and outputs a control signal CON for controlling the frequency adjustor 114.

The frequency adjustor 114 adjusts the frequency of the transmitting device 110' based on the control signal CON so that the frequency of the transmitting device 110' is the same as that of the receiving device 120'. This will be described in detail with reference to FIGS. 6 through 9 later.

Figure 4:
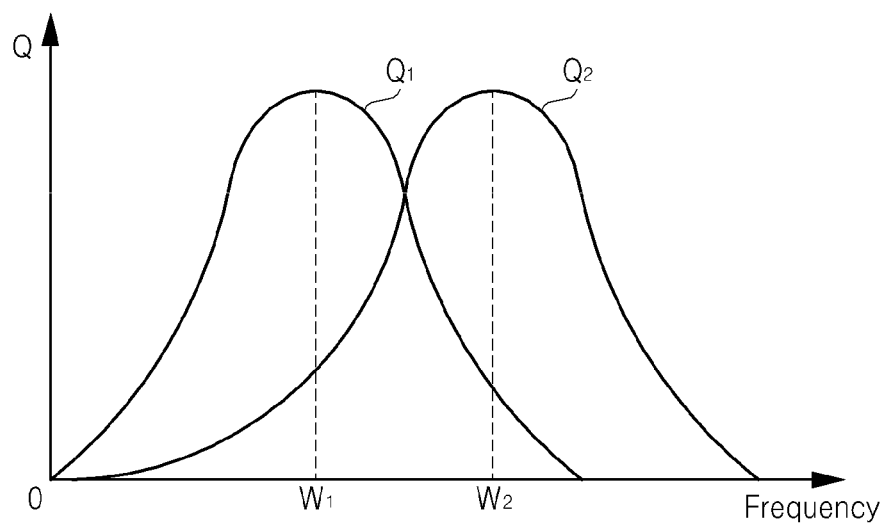
FIG. 4 is a graph showing frequency versus quality factor "Q" for the wireless energy transmission system of FIG. 1.

FIG. 4 is a graph illustrating relationships between frequency and quality factor "Q" in the wireless energy transmission system 100 of FIG. 1. In FIG. 4, a curve $Q_1$ indicates the quality factor of the transmitting device 110 and a curve $Q_2$ indicates the quality factor of the receiving device 120. When the receiving device 120 has a frequency of $W_2$, energy transfer efficiency decreases according to the quality factor $Q_1$ of the transmitting device 110. In particular, the higher quality factor the wireless energy transmission system 100 requires, the greater the change in the energy transfer efficiency depending on the change in frequency.

The transmitting device 110 has a maximum quality factor at the frequency $W_1$, and therefore, the efficiency of energy transfer to the receiving device 120 is maximum at the frequency $W_1$.

Accordingly, the energy transfer efficiency can be increased by matching resonance frequency between the transmitting device 110 and the receiving device 120 by adjusting the frequency of the receiving device 120 from $W_2$ to $W_1$.

Figure 5:
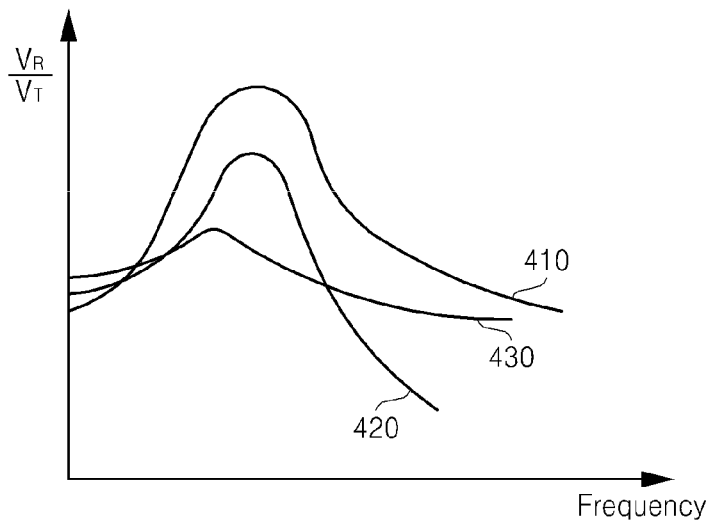
FIG. 5 is a graph further illustrating resonance frequency versus the energy transfer rate in relation to selected quality factors.

FIG. 5 is a diagram illustrating resonance frequency versus an energy transfer rate of $V_R/V_T$ as a function of quality factor. Referring to FIG. 5, the quality factor decreases in order of a first plot 410, a second plot 420, and a third plot 430.

Referring to the first graph 410 having the highest quality factor, the energy transfer rate $V_R/V_T$ rapidly drops when the resonance frequency even slightly changes.

Accordingly, when the wireless energy transmission system 100 of FIG. 1 requires a high quality factor, matching of the resonance frequency between the transmitting device 110 and the receiving device 120 may be very important.

Figure 6:
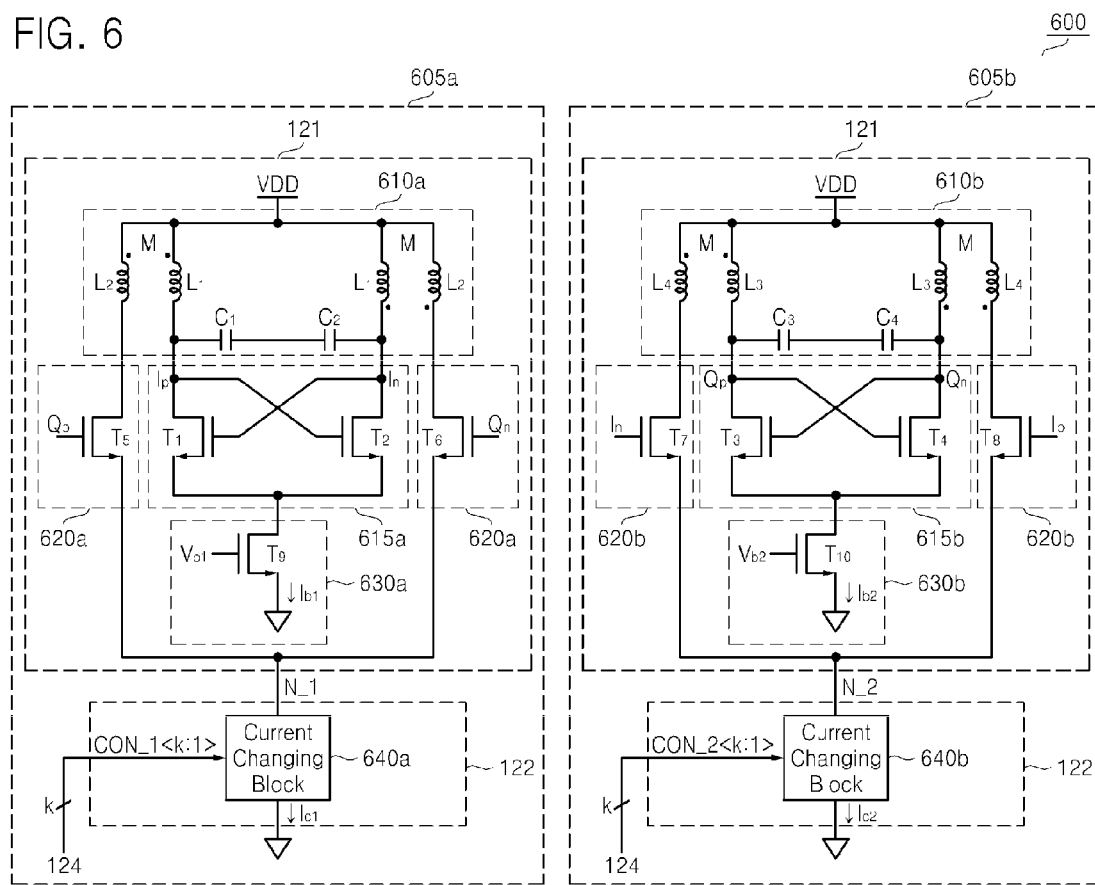

FIGS. 6 and 7A are circuit diagrams illustrating a quadrature oscillator 600 that may be included in the transmitting device 110 and/or the receiving device 120 of the wireless transmission system 100 of FIG. 1 according to certain embodiments of the inventive concept. In other words, the quadrature oscillator 600 illustrated in FIGS. 6 and 7A may be used in the embodiments including the variable frequency oscillator 121 and the frequency adjustor 122 illustrated in FIG. 2 and may also be used in the embodiments including the variable frequency oscillator 112' and the frequency adjustor 114 illustrated in FIG. 3. Hereinafter, a case using the quadrature oscillator 600 in the embodiments including the variable frequency oscillator 121 and the frequency adjustor 122 illustrated in FIG. 2 will be described. The quadrature oscillator 600 illustrated in FIG. 6 is equivalent to that illustrated in FIG. 7A.

Referring to FIGS. 6 and 7A, the quadrature oscillator 600 includes a first oscillator 605a and a second oscillator 605b.

The first oscillator 605a may output an I signal and the second oscillator 605b may output a Q signal that has a 90-degree phase difference from the I signal.

The first oscillator 605a includes a resonance circuit block 610a, a negative resistance block 615a, a coupling circuit block 620a, a bias block 630a, and a current changing block 640a. The second oscillator 605b includes a resonance circuit block 610b, a negative resistance block 615b, a coupling circuit block 620b, a bias block 630b, and a current changing block 640b.

The resonance circuit block 610a includes inductors $L_1$ and $L_2$ and capacitors $C_1$ and $C_2$ and determines the frequency of I signals $I_p$ and $I_n$. Mutual inductance occurs between the inductors $L_1$ and $L_2$ and a mutual inductance value is M.

The resonance circuit block 610b includes inductors $L_3$ and $L_4$ and capacitors $C_3$ and $C_4$ and determines the frequency of Q signals $Q_p$ and $Q_n$. Mutual inductance occurs between the inductors $L_1$ and $L_2$ and a mutual inductance value is M.

Each of the inductors $L_1$, $L_2$, $L_3$, and $L_4$ may be implemented as an on-chip inductor, but the inventive concept is not restricted thereto. The on-chip inductor may be implemented with conductor (e.g., metal) wiring on a semiconductor chip.

The resonance circuit block 610a has positive resistance inherent in the inductors $L_1$ and $L_2$ and the capacitors $C_1$ and $C_2$ a when it is not ideal, and therefore, the output of the resonance circuit block 610a may exhibit the response characteristics of an RLC circuit. As a result, damping oscillation may occur.

The resonance circuit block 610b also has positive resistance inherent in the inductors $L_3$ and $L_4$ and the capacitors $C_3$ and $C_4$ a when it is not ideal, and therefore, the output of the resonance circuit block 610b may exhibit the response characteristics of an RLC circuit. As a result, damping oscillation may occur.

Accordingly, the negative resistance blocks 615a and 615b are connected to the resonance circuit blocks 610a and 610b, respectively, to generate negative resistance counterbalancing the positive resistance of the resonance circuit blocks 610a and 610b.

The negative resistance block 615a includes cross-coupled N-type metal oxide semiconductor (NMOS) transistors $T_1$ and $T_2$. The NMOS transistors $T_1$ and $T_2$ are cross-coupled so that the negative I signal $I_n$ is output through a terminal of the NMOS transistor $T_2$ and is input to a gate of the NMOS transistor $T_1$ and the positive I signal $I_p$ is output through a terminal of the NMOS transistor $T_1$ and is input to a gate of the NMOS transistor $T_2$.

The negative resistance block 615b includes cross-coupled NMOS transistors $T_3$ and $T_4$. The NMOS transistors $T_3$ and $T_4$ are cross-coupled so that the negative Q signal $Q_n$ is output through a terminal of the NMOS transistor $T_4$ and is input to a gate of the NMOS transistor $T_3$ and the positive Q signal $Q_p$ is output through a terminal of the NMOS transistor $T_3$ and is input to a gate of the NMOS transistor $T_4$.

The coupling circuit block 620a includes two NMOS transistors $T_5$ and $T_6$. The coupling circuit block 620b includes two NMOS transistors $T_7$ and $T_8$. The coupling circuit blocks 620a and 620b may couple the first and second oscillators 605a and 605b, respectively.

The positive Q signal $Q_p$ is input to a gate of the NMOS transistor $T_5$ and the negative Q signal $Q_n$ is input to a gate of the NMOS transistor $T_6$.

The negative I signal $I_n$ is input to a gate of the NMOS transistor $T_7$ and the positive I signal $I_p$ is input to a gate of the NMOS transistor $T_8$.

The bias blocks 630a and 630b are connected to the negative resistance blocks 615a and 615b, respectively, and include NMOS transistors $T_9$ and $T_{10}$, respectively.

The NMOS transistors $T_9$ and $T_{10}$ adjust bias currents $I_{b1}$ and $I_{b2}$, respectively, based on bias voltages $V_{b1}$ and $V_{b2}$, respectively, input to their gates.

The current changing block 640a may change current flowing in the resonance circuit block 610a based on an input control signal CON_1 received from the frequency monitor 124. The current changing block 640b may change current flowing in the resonance circuit block 610b based on an input control signal CON_2 received from the frequency monitor 124.

For instance, currents $I_{c1}$ and $I_{c2}$ may be changed based on the input control signals CON_1 and CON_2, respectively. Currents flowing in the resonance circuit blocks 610a and 610b, and more particularly, currents flowing in the inductors $L_2$ and $L_4$ may be changed by the coupling circuit blocks 620a and 620b. The input control signals CON_1 and CON_2 may be digital signals of at least two bits. The input control signals CON_1 and CON_2 may be the same as or different from each other. The input control signals CON_1 and CON_2 may be symmetrical (e.g., complementary) to each other.

The current changing blocks 640a and 640b will be described in some additional detail with reference to FIGS. 8, 9 and 10.

Consequently, the frequency of a signal generated by the first and second oscillators 605a and 605b is changed without directly changing the inductance of the inductors $L_1$ through $L_4$ and the capacitance of the capacitors $C_1$ through $C_4$. This will be described in detail with reference to FIG. 11 later.

Figure 7B:
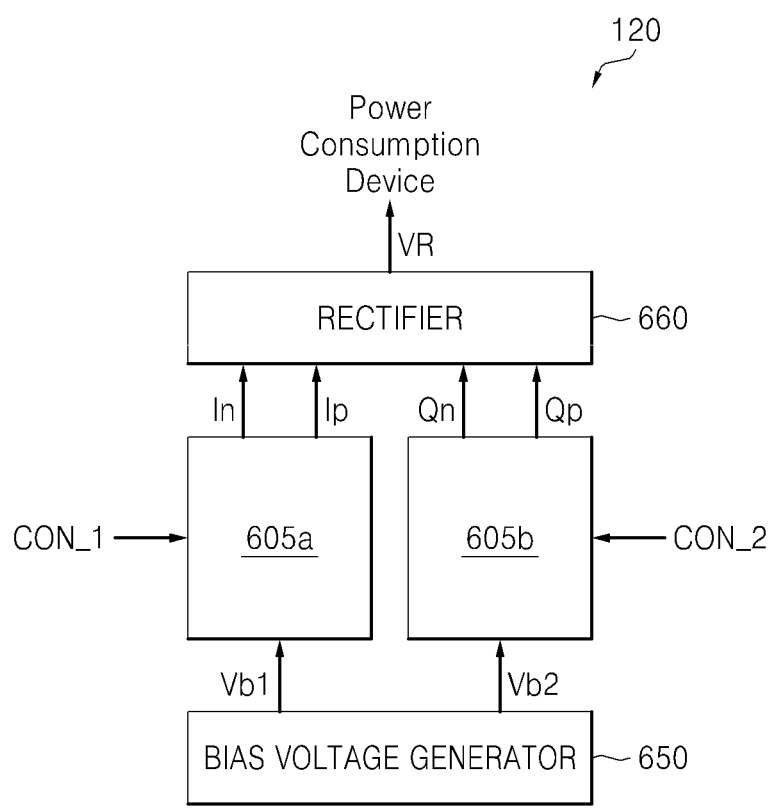
FIG. 7B is a block diagram of a quadrature oscillator that may be included in the transmitting device and/or a receiving device of FIGS. 6 and 7A according to other embodiments of the inventive concept.

FIG. 7B is a block diagram of the receiving device 120 of FIG. 1 according to certain embodiments of the inventive concept. Referring to FIGS. 6 through 7B, the receiving device 120 further includes a bias voltage generator 650 and a rectifier 660 in the quadrature oscillator 600 illustrated in FIGS. 6 and 7A. It will be apparent to those skilled in the art that the receiving device 120 may include the frequency monitor 124 of FIG. 2 or the frequency monitor 116 of FIG. 3.

The bias voltage generator 650 generates the bias voltages $V_{b1}$ and $V_{b2}$ input to the gates of the respective NMOS transistors $T_9$ and $T_{10}$. The rectifier 660 converts the I signals $I_p$ and $I_n$ output from the resonance circuit block 610a and the Q signals $Q_p$ and $Q_n$ output from the resonance circuit block 610b into the reception power VR. For instance, the rectifier 660 may rectify alternating current (AC) power based on the I signals $I_p$ and $I_n$ and the Q signals $Q_p$ and $Q_n$, thus generating direct current (DC) power, i.e., the reception power VR.

FIG. 7B is a block diagram of a receiving device consistent with embodiments of the inventive concept, but a transmitting device may be similarly configured.

Figure 8:
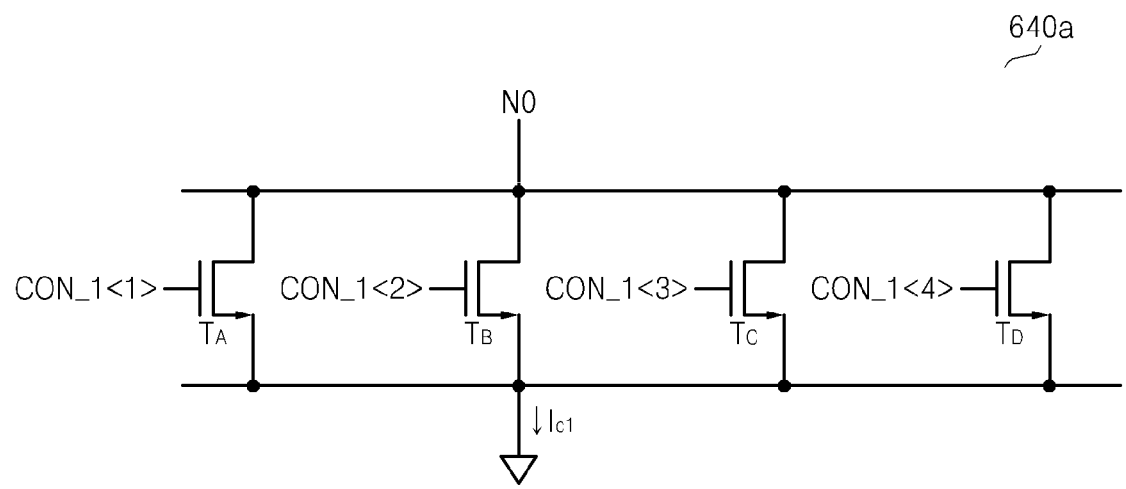
FIGS. 8, 9 and 10 are circuit diagrams illustrating the current changing block of FIGS. 6 and 7A according to certain embodiments of the inventive concept.
Figure 9:
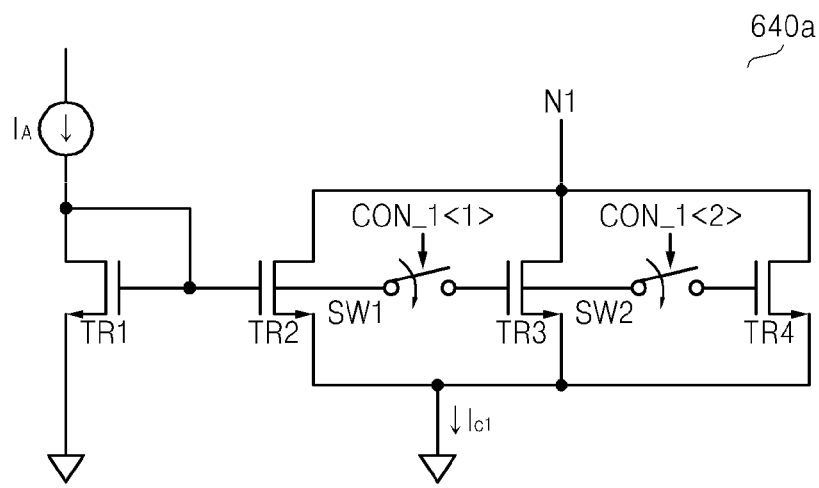
Figure 10:
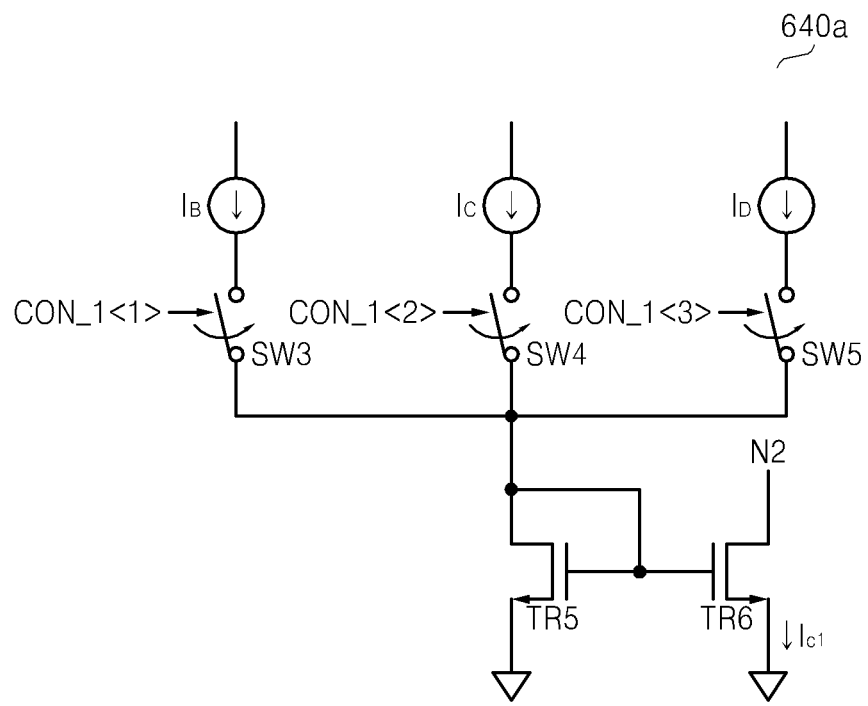

FIGS. 8, 9 and 10 are circuit diagrams of the current changing blocks 640a and 640b of FIGS. 6 and 7 according to certain embodiments of the inventive concept. Only the current changing block 640a will be described in detail to avoid redundancy since the structure and operation of the current changing block 640a may be the same as those of the current changing block 640b.

In the example illustrated in FIG. 8, the current changing block 640a includes at least two NMOS transistors but may variously configured (e.g., with four NMOS transistors $T_A$, $T_B$, $T_C$, and $T_D$).

Referring to FIG. 8, the input control signal CON_1 is applied to gates of the respective NMOS transistors $T_A$, $T_B$, $T_C$, and $T_D$. The NMOS transistors $T_A$, $T_B$, $T_C$, and $T_D$ are selectively switched in response to the input control signal CON_1. The input control signal CON_1 may be a 4-bit digital signal. When the 4-bit digital signal is "1100", the two NMOS transistors $T_A$ and $T_B$ among the four NMOS transistors $T_A$, $T_B$, $T_C$, and $T_D$ are switched ON and the other two NMOS transistors $T_C$ and $T_D$ are switched OFF.

The four NMOS transistors $T_A$, $T_B$, $T_C$, and $T_D$ may have different width-to-length ratios, so that current flowing in each of the NMOS transistors $T_A$, $T_B$, $T_C$, and $T_D$ can be changed. As a result, the current $I_{c1}$ can be changed.

A node NO in FIG. 8 corresponds to a node N_1 or N_2 in FIGS. 6 and 7A.

The current changing block 640a may be formed as a circuit including a current mirror and is configured to include four NMOS transistors $TR_1$, $TR_2$, $TR_3$, and $TR_4$ and a current source $I_A$ in the embodiments illustrated in FIG. 9.

Referring to FIG. 9, the input control signal CON_1 is applied to switches SW1 and SW2, which control an open and close (e.g., 0 and 1) switching operation in the current mirror.

The opening/closing of the switches SW1 and SW2 is controlled using the input control signal CON_1, so that the current $I_{c1}$ is changed. The input control signal CON_1 may be a 2-bit digital signal. When the input control signal CON_1 is "10", the switch SW1 is closed while the switch SW2 is opened.

In a case where the first and second switches SW1 and SW2 are opened, current $I_A$ flowing in the NMOS transistor $TR_1$ flows in the NMOS transistor $TR_2$ and no current flows in the NMOS transistors $TR_3$ and $TR_4$. Accordingly, the current $I_{c1}$ is the same as the current $I_A$.

In a case where only the first switch SW1 is closed, the current $I_A$ flows in the NMOS transistor $TR_3$ as well as the NMOS transistor $TR_2$. As a result, the current $I_{c1}$ becomes $2I_A$.

In a case where both of the first and second switches SW1 and SW2 are closed, the current $I_A$ flows in the NMOS transistors $TR_3$ and $TR_4$ as well as the NMOS transistor $TR_2$. As a result, the current $I_{c1}$ becomes 3 $I_A$.

It is apparent that the amount of the current $I_{c1}$ will also be differently adjusted when the size of the NMOS transistors $TR_1$, $TR_2$, $TR_3$, and $TR_4$ is changed.

A node N1 in FIG. 9 corresponds to the node N_1 or N_2 in FIGS. 6 and 7A.

The current changing block 640a may be formed as a circuit including a current mirror and is configured to include two NMOS transistors $TR_5$ and $TR_6$ and three current sources $I_B$, $I_C$, and $I_D$ in the embodiments illustrated in FIG. 10.

Referring to FIG. 10, the input control signal CON_1 is applied to switches SW3, SW4, and SW5, which control an open and close (e.g., 0 and 1) switching operation in the current sources $I_B$, $I_C$, and $I_D$.

The opening/closing of the switches SW3, SW4, and SW5 is controlled using the input control signal CON_1, so that the current $I_{c1}$ is changed. The input control signal CON_1 may be a 3-bit digital signal. When the input control signal CON_1 is "110", the switches SW3 and SW4 are closed while the switch SW5 is opened.

In a case where the third switch SW3 is closed and the fourth and fifth switches SW4 and SW5 are opened, current $I_B$ flowing in the NMOS transistor $TR_5$ flows in the NMOS transistor $TR_6$. Accordingly, the current $I_{c1}$ is the same as the current $I_B$.

In a case where the third and fourth switches SW3 and SW4 are closed and the fifth switch SW5 is opened, current $I_B+I_C$ flows in the NMOS transistor $TR_6$. Accordingly, the current $I_{c1}$ becomes $I_B+I_C$.

In a case where all of the third through fifth switches SW3, SW4, and SW5 are closed, current $I_B+I_C+I_D$ flows in the NMOS transistor $TR_6$. Accordingly, the current $I_{c1}$ becomes $I_B+I_C+I_D$.

It is apparent that the amount of the current $I_{c1}$ will also be differently adjusted when the size of the NMOS transistors $TR_5$ and $TR_6$ is changed.

A node N2 in FIG. 10 corresponds to the node N_1 or N_2 in FIGS. 6 and 7A.

Figure 11:
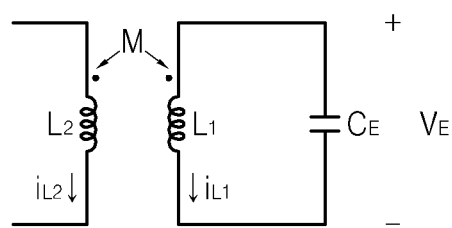
FIG. 11 is an equivalent circuit diagram for the resonant circuit block of FIGS. 6 and 7A.

FIG. 11 is an equivalent circuit diagram for the resonant circuit block 610a or 610b of FIGS. 6 and 7. One approach to the adjustment of the resonance frequency in the resonant circuit blocks 610a and 610b will be described with reference to FIG. 11.

When the frequency of the equivalent circuit illustrated in FIG. 11 is denoted by "w", the following relationship exists:

$$V_E = jwL_1i_{L1} + jwMi_{L2} = i_{L1}/(jwC_E). \quad (1)$$

In the quadrature oscillator 600 illustrated in FIGS. 6 and 7A, current $i_{L1}$ flowing in the inductor $L_1$ and current $i_{L2}$ flowing in the inductor $L_2$ have a 0- or 180-degree phase difference from each other. Accordingly, $i_{L2} = \alpha i_{L1}$ where $\alpha$ is a real number. Equation 1 may be rewritten as Equation 2:

$$V_E = jw(L_1 + \alpha M)i_{L1}. \quad (2)$$

Consequently, the value of $\alpha$ can be changed by changing the current $i_{L2}$ flowing in the inductor $L_2$, so that an inductance value viewed from a capacitor $C_E$ can be changed.

Generally, a resonance frequency $w_0$ with respect to a capacitor C and an inductor L is defined as $$\sqrt{\frac{1}{LC}},$$

and therefore, the resonance frequency of the resonant circuit blocks 610a and 610b can be changed.

Referring to FIG. 11, when the current $i_{L2}$ flowing in the inductor $L_2$ is changed by the current changing blocks 640a and 640b, an inductance value viewed from the capacitor $C_E$ is changed from $L_1$ to $L_1+\alpha M$. Accordingly, the resonance frequency of the resonant circuit blocks 610a and 610b can be changed.

Figure 12:
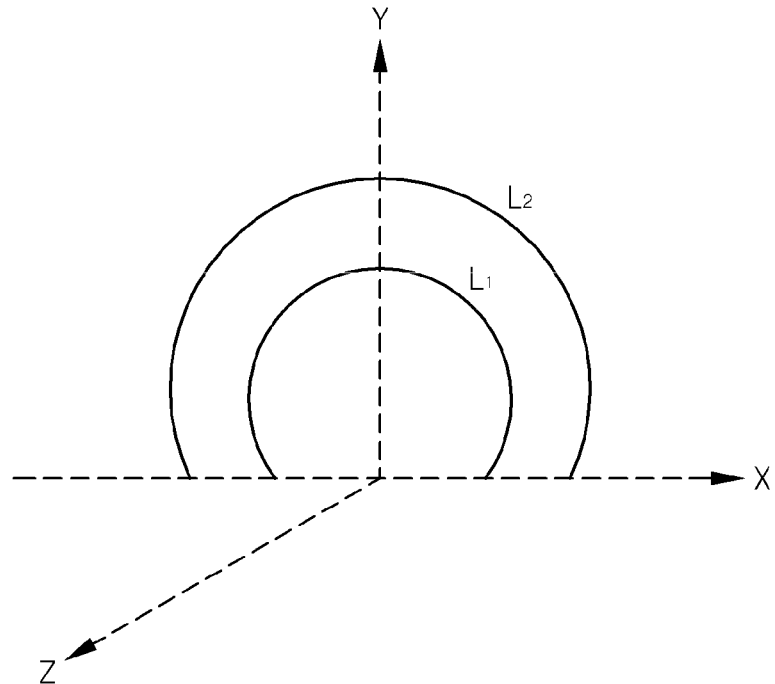
FIGS. 12 and 13 are three-dimensional coordinate system diagrams illustrating inductors for the quadrature oscillator of FIG. 7A.
Figure 13:
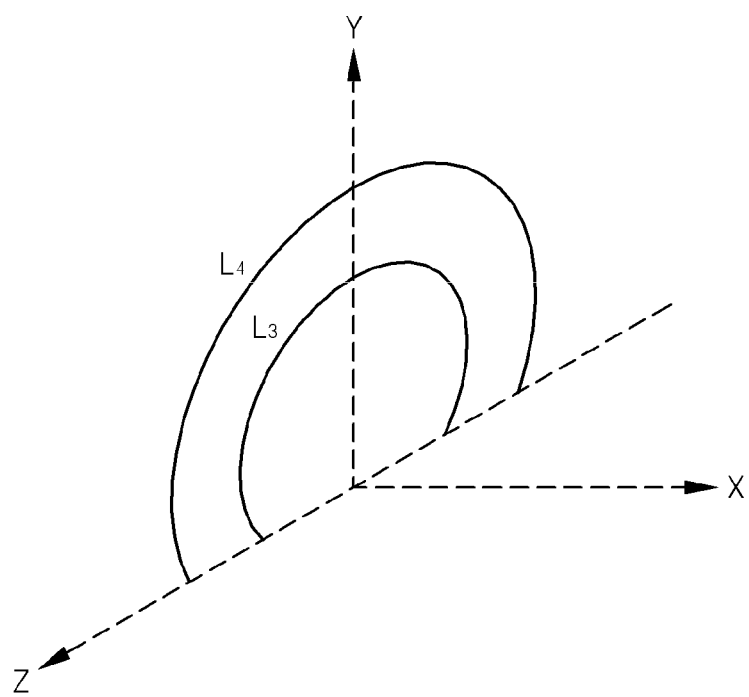

FIGS. 12 and 13 are three-dimensional coordinate system diagrams illustrating inductors of the quadrature oscillator 600 of FIG. 7A according to certain embodiments of the inventive concept. FIG. 12 shows the inductors $L_1$ and $L_2$ of the first oscillator 605a in the quadrature oscillator 600. FIG. 13 shows the inductors $L_3$ and $L_4$ of the second oscillator 605b in the quadrature oscillator 600.

FIGS. 12 and 13 show that the inductors $L_1$ and $L_2$ are disposed perpendicular to the inductors $L_3$ and $L_4$, but the inventive concept is not restricted to the current embodiments. For instance, the inductors $L_1$ and $L_2$ may be disposed in parallel to the inductors $L_3$ and $L_4$ or may be disposed at a certain angle (e.g., 0 through 180 degrees) to the inductors $L_3$ and $L_4$.

When the transmitting device 110 includes the quadrature oscillator 600 illustrated in FIGS. 12 and 13, even if an inductor (not shown) included in the receiving device 120 is perpendicular to the inductors $L_1$ and $L_2$ of the first oscillator 605a, a Q signal orthogonal to an I signal output from the first oscillator 605a can be output using the inductors $L_3$ and $L_4$ of the second oscillator 605b, so that energy can be transferred to the receiving device 120.

In other words, when the inductors $L_1$ and $L_2$ of the first oscillator 605a are disposed in a perpendicular relationship with the inductors $L_3$ and $L_4$ of the second oscillator 605b in the transmitting device 110, the receiving device 120 can be stably receive wireless energy without being much bound by the positions of the inductors $L_1$, $L_2$, $L_3$, and $L_4$ included in the receiving device 120.

The transmitting device 110 may be installed in a particular region (hereinafter, referred to as a "charge zone") so that the receiving device 120 can receive wireless energy. The charge zone may be the inside or outside of a building or an automobile. The transmitting device 110 may be installed in the charge zone such that the inductors $L_1$ and $L_2$ of the first oscillator 605a are at right angles to the inductors $L_3$ and $L_4$ of the second oscillator 605b.

Figure 14:
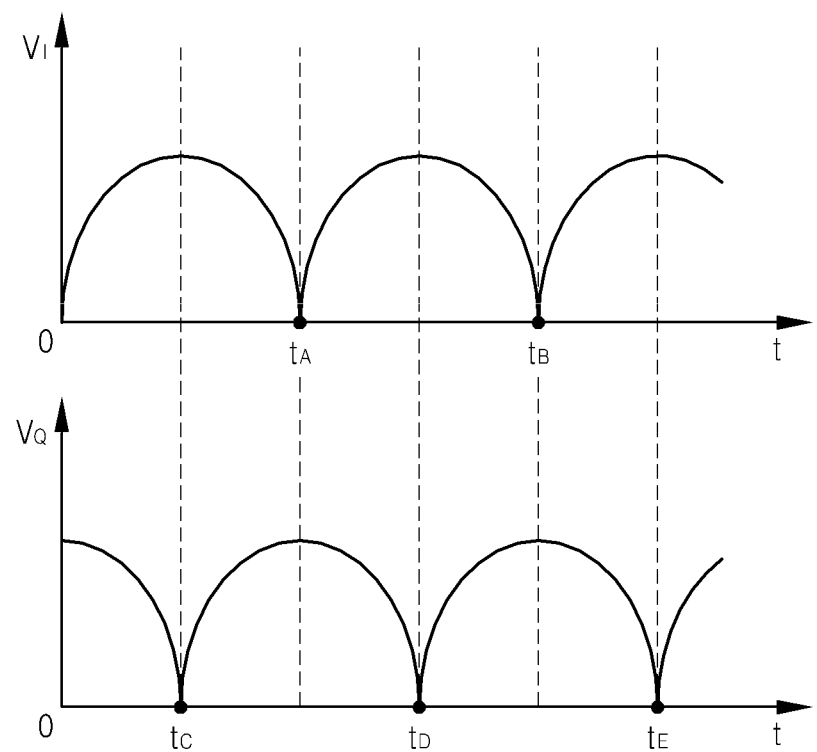
FIG. 14 is a diagram illustrating rectified waveforms that may be output by a quadrature oscillator according to certain embodiments of the inventive concept.

FIG. 14 is a diagram of rectified waveforms output from a quadrature oscillator according to certain embodiments of the inventive concept. The quadrature oscillator 600 illustrated in FIG. 7A outputs rectified outputs $V_I$ and $V_Q$ having the waveforms illustrated in FIG. 14 over time.

When only one of the waveforms of the rectified outputs $V_I$ and $V_Q$ is used to transfer energy to the receiving device 120, a problem may occur due to discontinuity at zero voltage points $t_A$, $t_B$, $t_C$, $t_D$, and $t_E$.

However, when both of the transmitting device 110 and the receiving device 120 include the quadrature oscillator 600 according to embodiments of the inventive concept, one of the rectified outputs $V_I$ and $V_Q$ is at a peak at the zero voltage points $t_A$ and $t_B$ or $t_C$, $t_D$, and $t_E$ of the other one of the rectified outputs $V_I$ and $V_Q$. As a result, energy transfer can be performed more efficiently.

Figure 15:
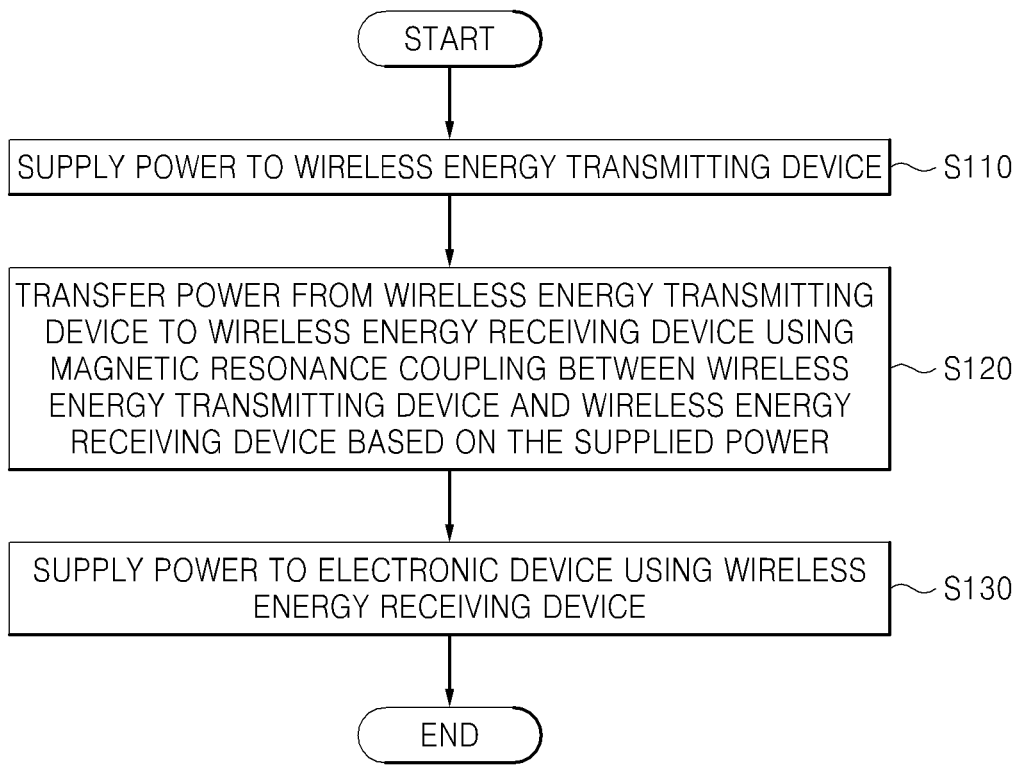
FIGS. 15, 16 and 17 are flowcharts the summarize wireless energy transmissions methods according to certain embodiments of the inventive concept.
Figure 16:
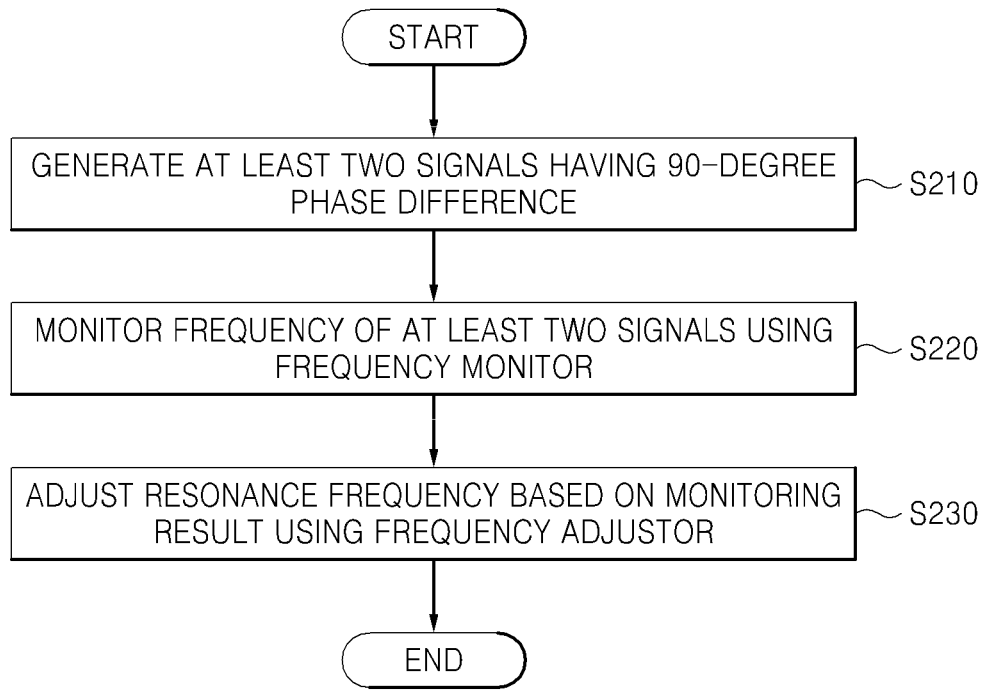
Figure 17:
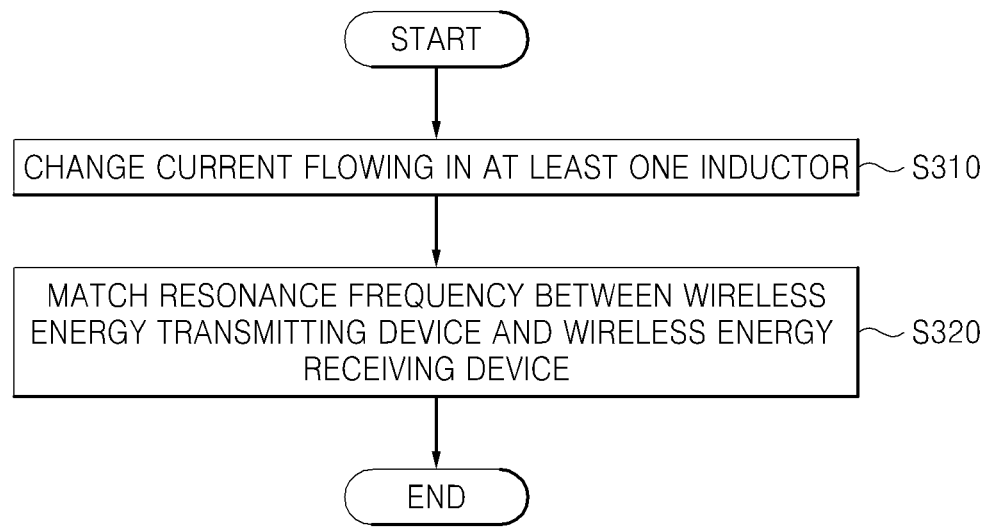

FIGS. 15, 16 and 17 are flowcharts summarizing wireless energy transmission methods according to embodiments of the inventive concept. The wireless energy transmission method may be performed by the wireless energy transmission system 100 of FIG. 1.

FIG. 15 is a general flowchart for the wireless energy transmission method performed by the wireless energy transmission system 100. FIG. 16 is a flowchart more particularly describing the frequency adjustment performed by the transmitting device 110 or the receiving device 120 of the wireless energy transmission system 100, and FIG. 17 is a flowchart even more particularly describing the frequency adjustment.

Referring to FIG. 15, power is supplied by a power supply to a wireless energy transmitting device (S110).

Based on the supplied power, power is transferred from the wireless energy transmitting device to a wireless energy receiving device through a magnetic field between the wireless energy transmitting device and the wireless energy receiving device (S120). In order efficiently transfer power to the wireless energy receiving device, frequency matching is performed between the wireless energy transmitting device and the wireless energy receiving device.

For the frequency matching, a frequency of the wireless energy receiving device may be adjusted. At least two signals having a 90-degree phase difference may be transmitted to the wireless energy receiving device. The amount of current flowing in an inductor within the wireless energy receiving device may be changed so that the frequency matching between the wireless energy transmitting device and the wireless energy receiving device can be accomplished. As described above, in other embodiments, a frequency of the wireless energy transmitting device may be adjusted.

The power transferred to the wireless energy receiving device is supplied to a power consumption electronic device connected to the wireless energy receiving device (S130).

Referring to FIG. 16, a signal generator generates at least two signals (e.g., an I signal and a Q signal) having a 90-degree phase difference (S210).

A frequency monitor monitors a frequency of the at least two signals (S220). A frequency adjustor adjusts the frequency of the wireless energy receiving device based on a monitoring result (S230) so that the frequency matching between the wireless energy transmitting device and the wireless energy receiving device is accomplished. That is, the frequency may be adjusted by changing the amount of current flowing in an inductor within the wireless energy receiving device.

Referring to FIG. 17, for the frequency matching between the wireless energy transmitting device and the wireless energy receiving device, the amount of current flowing in an inductor within the wireless energy receiving device is changed (S310).

Accordingly, a resonance frequency is matched between the wireless energy transmitting device and the wireless energy receiving device (S320). Once the frequency matching is accomplished, energy can be efficiently transferred to the wireless energy receiving device.

As described above, in the wireless energy transmission method according to the embodiments illustrated in FIGS. 15, 16 and 17, the resonance frequency is tuned without directly adjusting an inductance value or a capacitance value, thereby realizing efficient wireless energy transmission.

Figure 18:
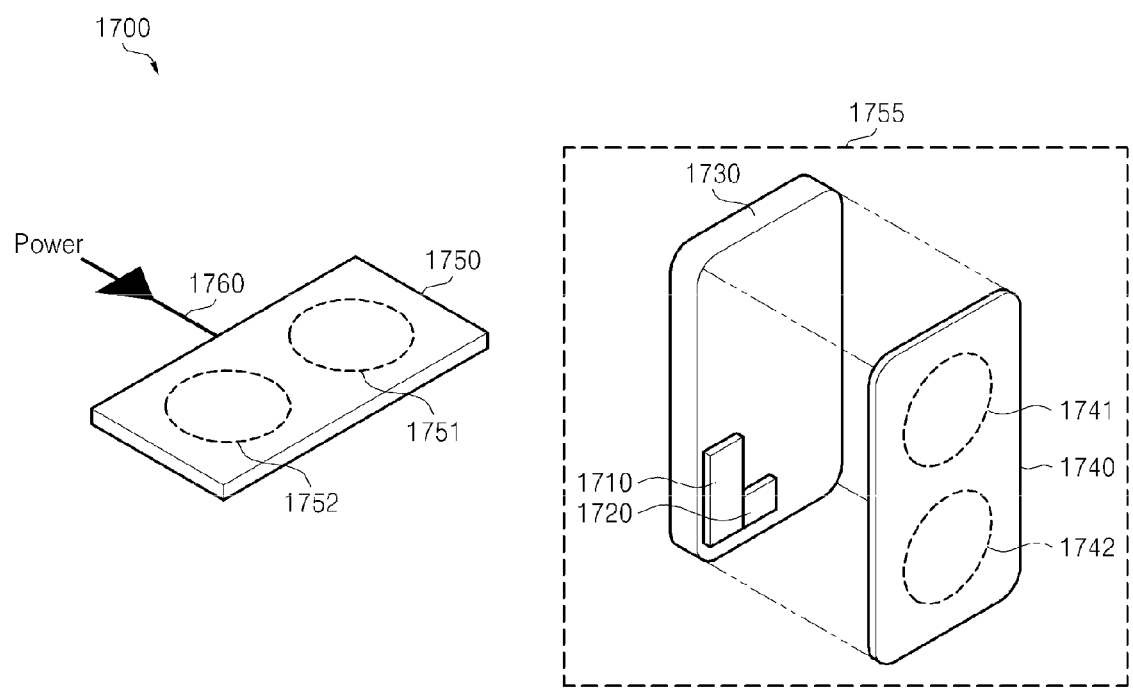
FIG. 18 is a diagram of a wireless energy transmission system according to certain embodiments of the inventive concept.

FIG. 18 is a diagram of a wireless energy transmission system 1700 according to certain embodiments of the inventive concept. Referring to FIG. 18, the wireless energy transmission system 1700 includes a transmitting device 1750 and a receiving device 1755. The transmitting device 1750 may be implemented in a form of a pad for transmitting energy and the receiving device 1755 may be a mobile device, e.g., a portable phone.

Although not shown, the transmitting device 1750 may be installed at a particular place or position, e.g., a wall, a table, or a bag, in a predetermined distance from the receiving device 1755 in order to transmit wireless energy to the receiving device 1755. The receiving device 1755 can receive energy from the transmitting device 1750 even if it is not in contact with or in a short distance from the receiving device 1755.

The transmitting device 1750 includes a first oscillator 1751 and a second oscillator 1752, which forms a quadrature oscillator, and is supplied with power from the outside through a connector 1760.

The receiving device 1755 includes a portable phone body 1730 and a portable phone case 1740. The portable phone body 1730 includes a battery 1710 and a charger 1720. The portable phone case 1740 includes a first oscillator 1741 and a second oscillator 1742, which forms a quadrature oscillator.

When power is supplied to the transmitting device 1750, energy is transmitted by the first and second oscillators 1751 and 1752 of the transmitting device 1750 to the first and second oscillators 1741 and 1742 of the receiving device 1755.

When the energy is transmitted to the receiving device 1755, the receiving device 1755 may charge the battery 1710 with the energy through the charger 1720.

Although the first and second oscillators 1741 and 1742 of the receiving device 1755 are positioned within the portable phone case 1740 in the embodiments illustrated in FIG. 18, the scope of the inventive concept is not restricted to these embodiments. For instance, the first and second oscillators 1741 and 1742 may be positioned within the portable phone body 1730.

Figure 19:
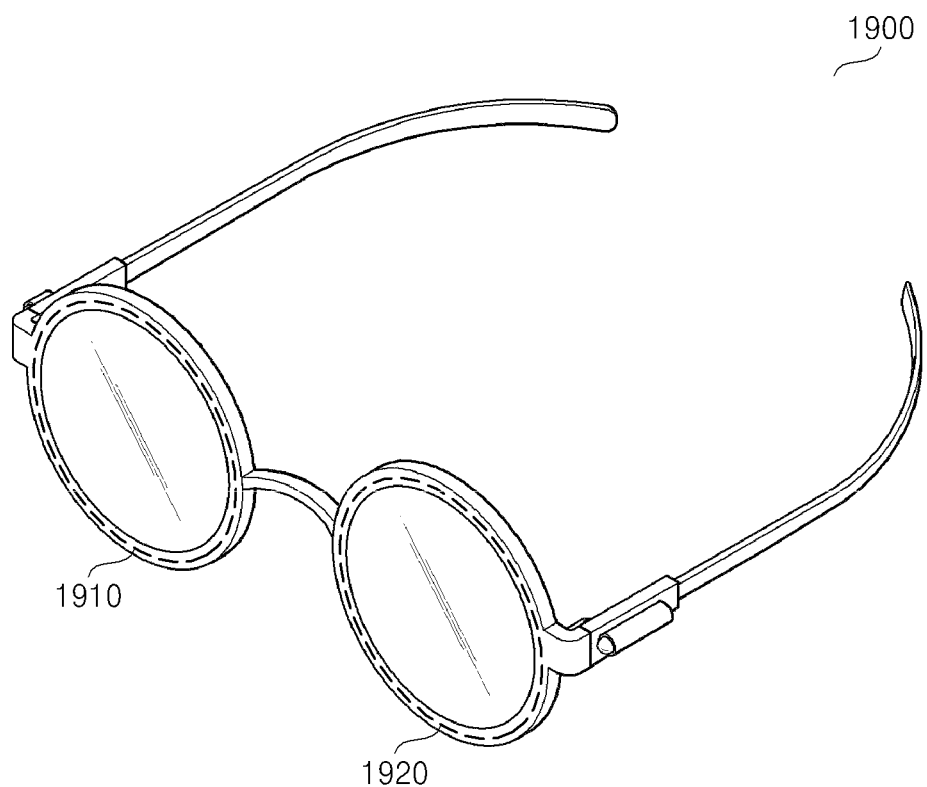
FIGS. 19, 20 and 21 are diagrams illustrating certain receiving devices according to embodiments of the inventive concept.
Figure 20:
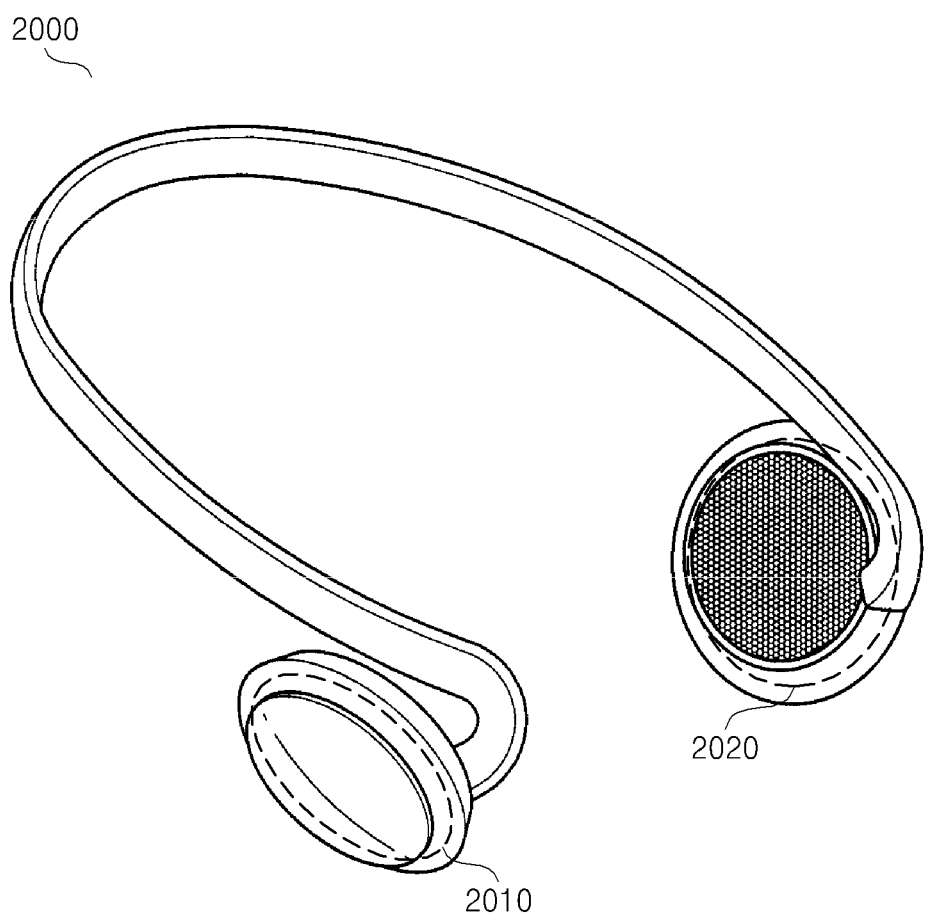
Figure 21:
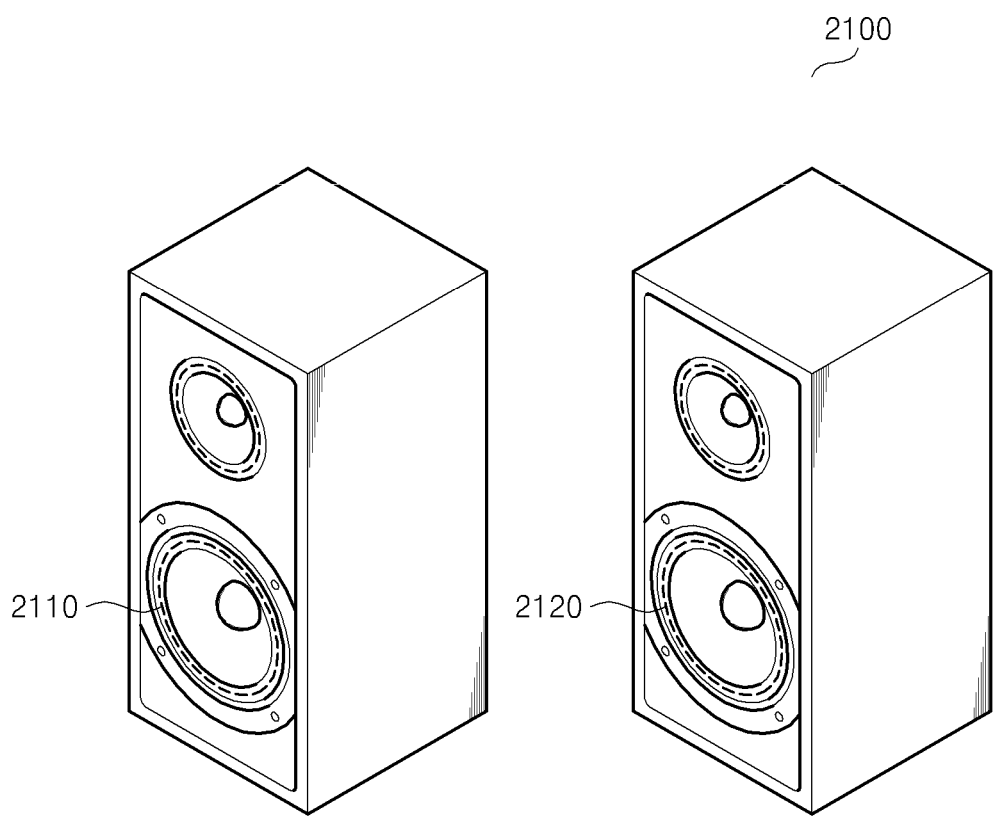

FIGS. 19, 20 and 21 are diagrams of the receiving device 120 according to different embodiments of the inventive concept. Unlike the embodiments illustrated in FIG. 18, the transmitting device 110 is omitted in the embodiments illustrated in FIGS. 19 through 21.

Referring to FIG. 19, the receiving device 120 may be implemented in a form of three-dimensional (3D) glasses 1900. The 3D glasses 1900 may include a first oscillator 1910 and a second oscillator 1920, which form a quadrature oscillator, in frames of two lenses, respectively.

Accordingly, when power is supplied to the transmitting device 110, energy can be supplied via a wireless connection to the 3D glasses 1900 positioned within a predetermined distance from the transmitting device 110.

Referring to FIG. 20, the receiving device 120 may be implemented in a form of a headset 2000, e.g., a Bluetooth headset. A first oscillator 2010 and a second oscillator 2020, which form a quadrature oscillator, may be included in the headset 2000 as illustrated in FIG. 20.

Accordingly, when power is supplied to the transmitting device 110, energy can be supplied via a wireless connection to the headset 2000 positioned within a predetermined distance from the transmitting device 110.

Referring to FIG. 21, the receiving device 120 may be implemented in a form of a surround sound speaker system 2100. A first oscillator 2110 and a second oscillator 2120, which form a quadrature oscillator, may be included in the surround sound speaker 2100 as illustrated in FIG. 21.

Accordingly, when power is supplied to the transmitting device 110, energy can be supplied via a wireless connection to the surround sound speaker system 2100 positioned within a predetermined distance from the transmitting device 110.

The receiving device 120 is implemented in both speakers of the surround sound speaker system 2100. Alternatively, the transmitting device 110 and the receiving device 120 may be implemented in the two speakers, respectively, of the surround sound speaker system 2100. As another alternative, the transmitting device 110 may be implemented in the surround sound speaker system 2100 and may transmit wireless energy to the receiving device 120 positioned nearby.

Figure 22:
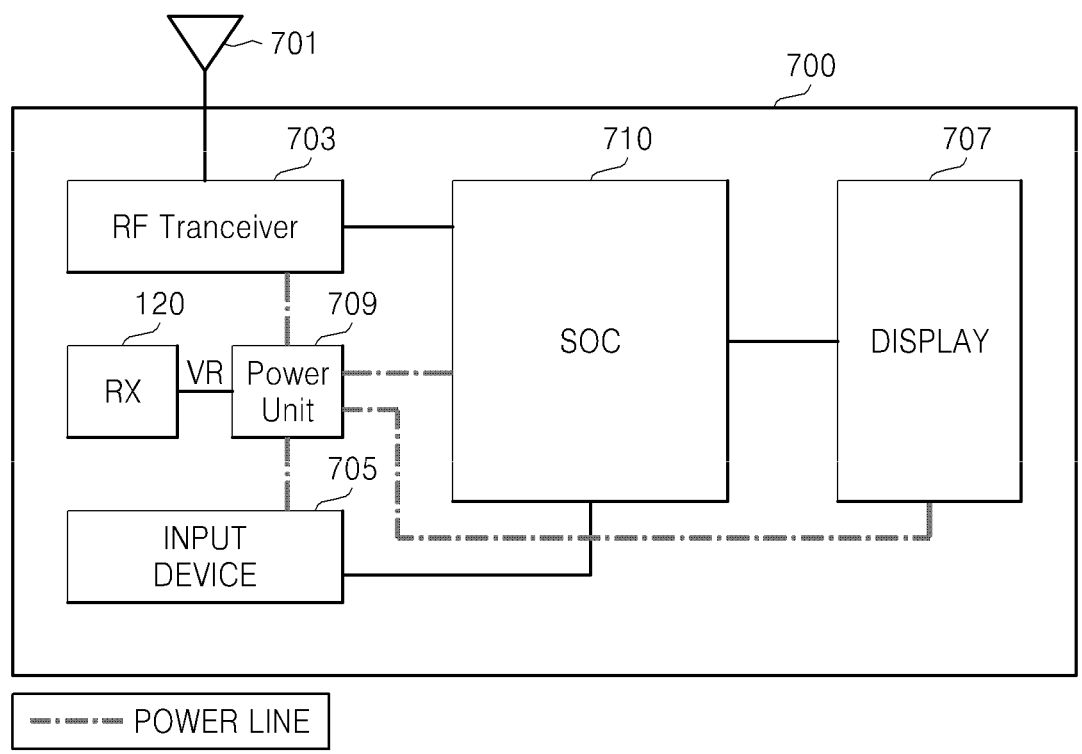
FIG. 22 is a block diagram of an electronic system including a wireless energy receiving device according to embodiments of the inventive concept.

FIG. 22 is a diagram of an electronic system 700 including the wireless energy receiving device 120 according to certain embodiments of the inventive concept. Referring to FIG. 22, the electronic system 700 includes the wireless energy receiving device 120, a system on chip (SoC) 710, an antenna 701, a radio frequency (RF) transceiver 703, an input device 705, a display 707, and a power unit 709.

The wireless energy receiving device 120, which is a wireless energy receiving device according to certain embodiments of the inventive concept, receives wireless energy from a wireless energy transmitting device, and it generates and supplies reception power VR to the power unit 709. The power unit 709 supplies internal power for the operations of the internal elements 703, 705, 707, and 710 of the electronic system 700.

The RF transceiver 703 transmits and receives RF signals through the antenna 701. The RF transceiver 703 may convert an RF signal received through the antenna 701 into a signal that can be processed by the SoC 710.

The SoC 710 processes the signal output from the RF transceiver 703 and transmits a processed signal to the display 707. The RF transceiver 703 may also convert a signal output from the SoC 710 into an RF signal and outputs the RF signal through the antenna 701. The SoC 710 may include a central processing unit (CPU) (not shown), which controls the overall operation of the electronic system 700.

The input device 705 enables control signals for controlling the operation of the SoC 710 or data to be processed by the SoC 710 to be input to the electronic system 700. The input device 705 may be implemented by a pointing device such as a touch pad or a computer mouse, a keypad, or a keyboard.

Figure 23:
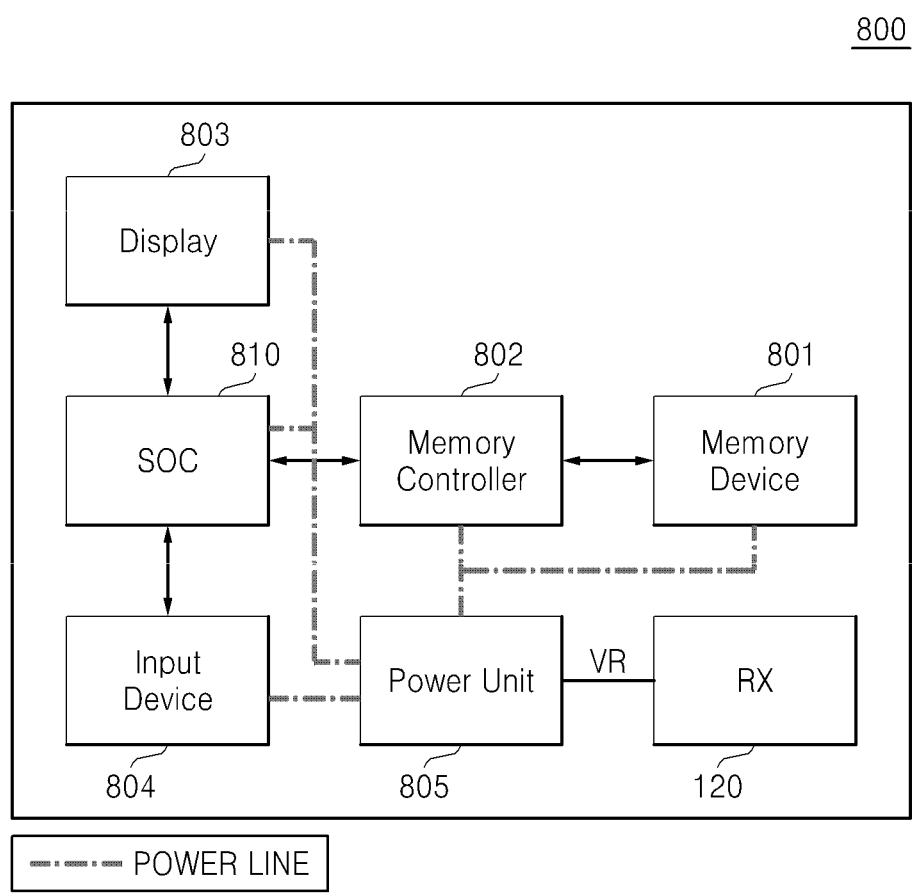
FIG. 23 is a block diagram of an electronic system including a wireless energy receiving device according to other embodiments of the inventive concept.

FIG. 23 is a diagram of an electronic system 800 including the wireless energy receiving device 120 according to other embodiments of the inventive concept. Referring to FIG. 23, the electronic system 800 may be implemented as a personal computer (PC), a network server, a tablet PC, a netbook, an e-reader, a personal digital assistant (PDA), a portable multimedia player (PMP), an MP3 player, or an MP4 player.

The electronic system 800 includes the wireless energy receiving device 120, a power unit 805, a SoC 810, a memory device 801, a memory controller 802 controlling the data processing operations of the memory device 801, a display 803, and an input device 804.

The wireless energy receiving device 120, which is a wireless energy receiving device according to certain embodiments of the inventive concept, receives wireless energy from a wireless energy transmitting device, and it generates and supplies reception power VR to the power unit 805. The power unit 805 supplies internal power for the operations of the internal elements 801, 802, 803, 804, and 810 of the electronic system 800.

The SoC 810 may display data stored in the memory device 801 through the display 803 according to data input through the input device 804. The input device 804 may be implemented by a pointing device such as a touch pad or a computer mouse, a keypad, or a keyboard. The SoC 810 may control the overall operation of the electronic system 800 and the operations of the memory controller 802. For this control, the SoC 810 may include a CPU (not shown).

The memory controller 802, which controls the operations of the memory device 801, may be implemented as a part of the SoC 810 or as a chip separated from the SoC 810.

Figure 24:
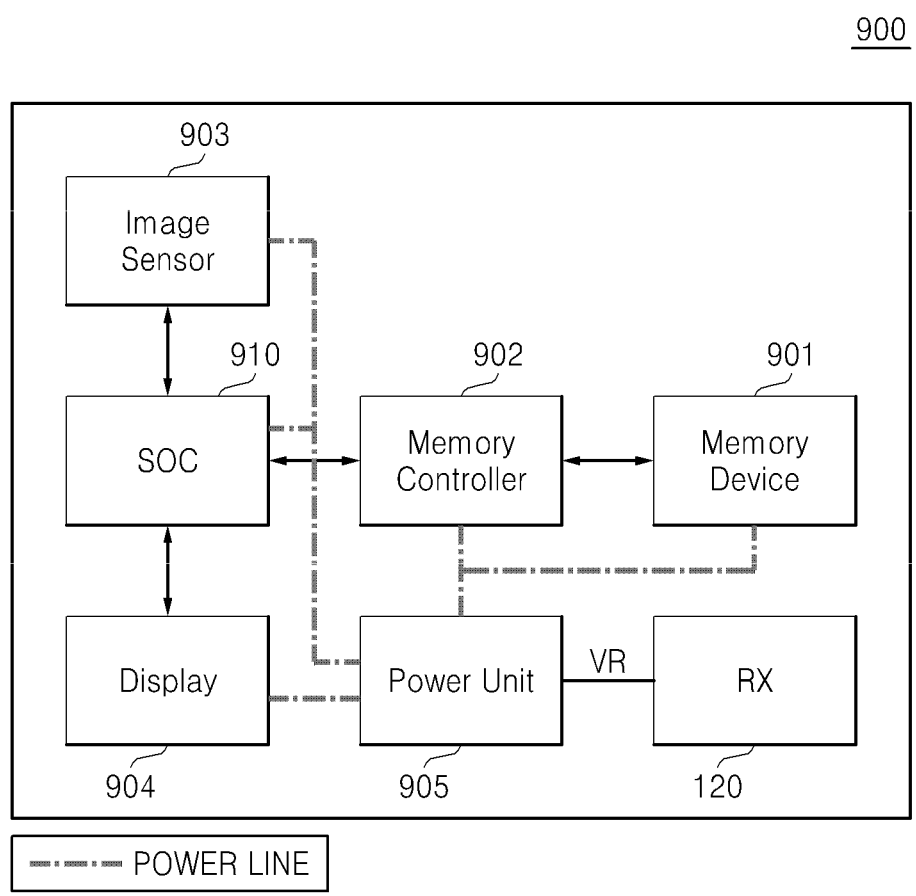
FIG. 24 is a block diagram of an electronic system including a wireless energy receiving device according to further embodiments of the inventive concept.

FIG. 24 is a diagram of an electronic system 900 including the wireless energy receiving device 120 according to further embodiments of the inventive concept. Referring to FIG. 24, the electronic system 900 may be implemented as an image processing device like a digital camera or a mobile phone equipped with a digital camera, a PDA, a PMP, or a smart phone.

The electronic system 900 includes the wireless energy receiving device 120, a power unit 905, a SoC 910, a memory device 901, and a memory controller 902 controlling the data processing operations of the memory device 901. The electronic system 900 may also include an image sensor 903 and a display 904.

The wireless energy receiving device 120, which is a wireless energy receiving device according to certain embodiments of the inventive concept, receives wireless energy from a wireless energy transmitting device, and it generates and supplies reception power VR to the power unit 905. The power unit 905 supplies internal power for the operations of the internal elements 901, 902, 903, 904, and 910 of the electronic system 900.

The image sensor 903 converts optical images into digital signals and outputs the digital signals to the SoC 910 or the memory controller 902. According to the control of the SoC 910, the digital signals may be displayed through the display 904 or stored in the memory device 901 through the memory controller 902.

Data stored in the memory device 901 may be displayed through the display 904 according to the control of the SoC 910 or the memory controller 902. The memory controller 902, which controls the operations of the memory device 901, may be implemented as a part of the SoC 910 or as a chip separated from the SoC 910. The SoC 910 may include a CPU (not shown) controlling the overall operation of the electronic system 900.

Figure 25A:
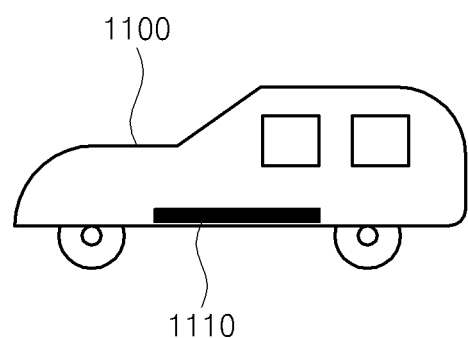
FIGS. 25A and 25B are conceptual diagrams illustrating an automotive application for a wireless energy receiving device according to certain embodiments of the inventive concept.
Figure 25B:
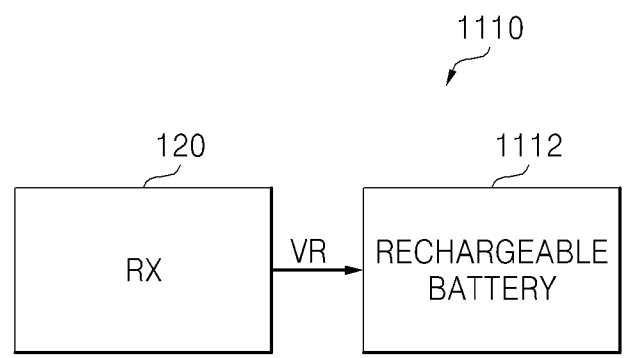

FIGS. 25A and 25B are diagrams of an automobile 1100 including the wireless energy receiving device 120 according to certain embodiments of the inventive concept. Referring to FIGS. 25A and 25B, the automobile 1100 includes a wireless charge unit 1110. The wireless charge unit 1110 may include the wireless energy receiving device 120 and a rechargeable battery 1112.

The wireless energy receiving device 120, which is a wireless energy receiving device according to certain embodiments of the inventive concept, receives wireless energy from a wireless energy transmitting device, and it generates and supplies reception power VR to the rechargeable battery 1112.

For instance, while the automobile 1100 is parked in a parking lot, the rechargeable battery 112 may be charged using a wireless energy transmission method according to certain embodiments of the inventive concept.

As described above, in a wireless energy receiving device, a wireless energy transmitting device, a wireless energy transmission system including both devices, and a wireless energy transmission method according to some embodiment of the inventive concept, a resonance frequency is tuned without directly adjusting an inductance value or a capacitance value, thereby realizing efficient wireless energy transmission.

While the inventive concept has been particularly shown and described with reference to embodiments thereof, it will be understood by those of ordinary skill in the art that various changes in forms and details may be made therein without departing from the scope of the inventive concept as defined by the following claims.

What is claimed is:

1. In a wireless energy transmission system including a wireless energy receiving device and a wireless energy transmitting device, at least one of the wireless energy receiving device and the wireless energy transmitting device comprising:
   a first oscillator configured to output an in-phase (I) signal;
   a second oscillator configured to output a quadrature-phase (Q) signal having a 90-degree phase difference from the I signal, wherein each of the first and second oscillators comprises a resonator having at least one inductor and at least one capacitor, and a current changing block connected to the at least one inductor and configured to change an amount of current flowing through the at least one inductor; and
   a monitor configured to monitor a frequency of at least one of the I and Q signals and control the current changing block according to a monitoring result.

2. The wireless energy transmission system of claim 1, further comprising:
   a sensor configured to sense a magnetic field between the wireless energy receiving device and the wireless energy transmitting device and further control the current changing block according to a sensing result.

3. The wireless energy transmission system of claim 1, wherein the resonator comprises:
   a first inductor pair having first mutual inductance and including a first inductor and a second inductor;
   a second inductor pair having second mutual inductance and including a third inductor and a fourth inductor;
   a capacitor connected between the first inductor and the third inductor; and
   a bias block configured to bias current flowing through the first and third inductors,
   wherein the current changing block changes current flowing through the second and fourth inductors.

4. The wireless energy transmission system of claim 3, wherein the least one inductor of the first oscillator is configured perpendicular to the at least one inductor of the second oscillator.

5. A wireless energy receiving device comprising:
   a first oscillator configured to output an in-phase (I) signal; and
   a second oscillator configured to output a quadrature-phase (Q) signal having a 90-degree phase difference from the I signal,
   wherein each of the first and second oscillators comprises:
   a first inductor pair having first mutual inductance and comprising a first inductor and a second inductor;
   a second inductor pair having second mutual inductance and comprising a third inductor and a fourth inductor; and
   a capacitor connected between the first inductor and the third inductor,
   wherein each of the first and second oscillators controls a magnitude of received wireless energy by changing a resonance frequency by changing an amount of current flowing through the second and fourth inductors.

6. The wireless energy receiving device of claim 5, wherein each of the first and second oscillators further comprises:
   a current changing block configured to change the amount of current flowing through the second and fourth inductors.

7. The wireless energy receiving device of claim 5, wherein the first and third inductors have the same inductance, and the second and fourth inductors have the same inductance.

8. The wireless energy receiving device of claim 5, wherein each of the first and second oscillators further comprises:
   a bias block configured to bias current flowing through the first and third inductors;
   cross-coupled transistors respectively connected between the first inductor and the bias block, and between the third inductor and the bias block;
   a transistor connected between the second inductor and the current changing block; and
   a transistor connected between the fourth inductor and the current changing block.

9. The wireless energy receiving device of claim 8, wherein the Q signal output by the second oscillator is applied to gates of the transistors in the first oscillator, and the I signal output by the first oscillator is applied to gates of the transistors in the second oscillator.

10. The wireless energy receiving device of claim 5, wherein at least one of the inductors in the first oscillator is configured perpendicular to at least one of the inductors in the second oscillator.

11. An electronic system comprising:
    a wireless energy receiving device configured to receive wireless energy from a wireless energy transmitting device through a magnetic field and generate reception power; and
    a power unit configured to receive the reception power from the wireless energy receiving device and supply at least a portion of internal power necessary for operation of the electronic system,
    wherein the wireless energy receiving device comprises:
    a first oscillator configured to output an in-phase (I) signal; and
    a second oscillator configured to output a quadrature-phase (Q) signal having a 90-degree phase difference from the I signal, and
    each of the first and second oscillators comprises:
    a resonator comprising at least one inductor and at least one capacitor; and
    a current changing block connected to the at least one inductor to change an amount of current flowing through the at least one inductor.

12. The electronic system of claim 11, wherein each of the first and second oscillators further comprises:
    a negative resistance block connected to the resonator to counterbalance positive resistance of the resonator; and
    a coupling circuit block connected to the at least one inductor to couple the first and second oscillators.

13. The electronic system of claim 12, wherein the current changing block comprises at least two N-type metal oxide semiconductor (NMOS) transistors connected in parallel, a terminal of the at least two NMOS transistors being connected to the coupling circuit block, and the at least two NMOS transistors being selectively switched in response to an input control signal applied to gates of the respective at least two NMOS transistors to change the amount of current flowing through the at least one inductor.

14. The electronic system of claim 11, wherein the current changing block comprises:
    a current source configured to supply a predetermined current;
    a first N-type metal oxide semiconductor (NMOS) transistor having a terminal connected to the current source; and at least two NMOS transistors connected to a gate of the first NMOS transistors as a current mirror, wherein the at least two NMOS transistors are selectively switched in response to an input control signal to change the amount of current flowing through the at least one inductor.

15. The electronic system of claim 11, wherein the current changing block comprises:
- at least two current sources connected in parallel to supply a predetermined current;
- a first N-type metal oxide semiconductor (NMOS) transistor having a terminal connected to the at least two current sources; and
- a second NMOS transistor connected to a gate of the first NMOS transistor as a current mirror, wherein the at least two current sources are selectively switched in response to an input control signal to change the amount of current flowing through the at least one inductor.

16. The electronic system of claim 11, wherein the wireless energy receiving device further comprises:
- a monitor configured to monitor a frequency of at least one of the I and Q signals and generate a control signal; and
- a frequency adjustor configured to change the frequency of the I and Q signals by changing the amount of current flowing through the at least one inductor in response to the control signal.

17. The electronic system of claim 11, wherein the electronic system is one selected from the group consisting of a smart phone, a mobile phone, a personal digital assistant (PDA), a portable multimedia player (PMP), and a tablet personal computer.

18. A method of receiving wireless energy using a wireless energy receiving device, the method comprising:
- generating an in-phase (I) signal and a quadrature-phase (Q) signal having a 90-degree phase difference from the I signal using a quadrature oscillator comprising at least one pair of inductors having mutual inductance; and
- adjusting a resonance frequency by changing an amount of current flowing through one inductor in the at least one pair of inductors.

19. The wireless energy receiving method of claim 18, further comprising:
- biasing current flowing in an inductor of the at least one pair of inductors using a predetermined bias current.

20. The wireless energy receiving method of claim 18, further comprising:
- monitoring a frequency of at least one of the in-phase (I) signal and the quadrature-phase (Q) signal and providing a monitoring result, wherein the adjusting of the resonance frequency by changing the amount of current flowing through the inductor is made in response to the monitoring result.

\* \* \* \* \*